United States Patent
Maeda et al.

(10) Patent No.: US 9,443,831 B2
(45) Date of Patent: Sep. 13, 2016

(54) SUBSTRATE FOR MOUNTING LED ELEMENT, LED LIGHT SOURCE AND LED DISPLAY

(71) Applicants: NORITAKE CO., LIMITED, Aichi (JP); NORITAKE ITRON CORPORATION, Mie (JP)

(72) Inventors: Tadami Maeda, Mie (JP); Naoki Noda, Mie (JP)

(73) Assignees: NORITAKE CO., LIMITED, Aichi (JP); NORITAKE ITRON CORPORATION, Mie (JP)

(*) Notice: Subject to any disclaimer, the term of this patent is extended or adjusted under 35 U.S.C. 154(b) by 0 days.

(21) Appl. No.: 14/425,553

(22) PCT Filed: Sep. 2, 2013

(86) PCT No.: PCT/JP2013/073529
§ 371 (c)(1),
(2) Date: Mar. 3, 2015

(87) PCT Pub. No.: WO2014/038506
PCT Pub. Date: Mar. 13, 2014

(65) Prior Publication Data
US 2015/0255436 A1   Sep. 10, 2015

(30) Foreign Application Priority Data
Sep. 4, 2012 (JP) ................................ 2012-194253

(51) Int. Cl.
*H01L 33/00* (2010.01)
*H01L 25/075* (2006.01)
(Continued)

(52) U.S. Cl.
CPC .......... *H01L 25/0753* (2013.01); *H01L 33/60* (2013.01); *H01L 33/62* (2013.01);
(Continued)

(58) Field of Classification Search
CPC ..... H01L 33/60; H01L 33/62; H01L 33/486; H01L 25/0753
USPC .................. 257/81, 88, 98, 99, 100
See application file for complete search history.

(56) References Cited

U.S. PATENT DOCUMENTS 7,872,410 B2 * 1/2011 Tasumi ............... G02B 6/0023
                                                         313/503
2008/0210968 A1   9/2008  Ishihara
2008/0284315 A1   11/2008 Tasumi

FOREIGN PATENT DOCUMENTS

JP   2004-119634 A   4/2004
JP   2007-226083 A   9/2007
(Continued)

OTHER PUBLICATIONS

Internation Search Report in corresponding PCT application dated Sep. 24, 2013.

*Primary Examiner* — Hung Vu
(74) *Attorney, Agent, or Firm* — Hedman & Costigan, P.C.; James V. Costigan; Kathleen A. Costigan

(57) ABSTRACT

Provided is a substrate for mounting an LED element in which a stable light-emitting surface is obtained, as well as a light source and an LED display using this substrate, so that the axis at which light is emitted by a chip LED does not vary. The substrate for mounting an LED element (1) comprises a substrate (1a) on which an LED element can be mounted, and a wiring layer (2) for supplying electricity to an LED element (7). The wiring layer (2) for supplying electricity to the LED element (7) is formed on a mirror-finished surface on the entirety of a substrate surface on which the LED element is mounted, except for an insulating space 4 capable of providing insulation between terminals of the LED element.

5 Claims, 7 Drawing Sheets

(51) Int. Cl.
*H01L 33/60* (2010.01)
*H01L 33/62* (2010.01)
*H05K 1/11* (2006.01)
*H01L 33/48* (2010.01)

(52) U.S. Cl.
CPC .. *H01L 33/486* (2013.01); *H01L 2224/48091* (2013.01); *H01L 2224/48472* (2013.01); *H01L 2924/3025* (2013.01); *H05K 1/11* (2013.01); *H05K 2201/10106* (2013.01)

(56) References Cited

FOREIGN PATENT DOCUMENTS

| | | |
|---|---|---|
| JP | 2008-218610 A | 9/2008 |
| JP | 2008-263083 A | 10/2008 |
| JP | 2009-231785 A | 10/2009 |
| JP | 2010-204441 A | 9/2010 |

\* cited by examiner

SUBSTRATE FOR MOUNTING LED ELEMENT, LED LIGHT SOURCE AND LED DISPLAY

TECHNICAL FIELD

The present invention relates to a substrate for mounting an LED element, as well as an LED light source and an LED display using this substrate.

BACKGROUND ART

Compact, low-power-consumption light sources on which LED elements are mounted are frequently used in illumination for improving the visibility of displays, active displays for home electronics and industrial products, and other such applications.

In order to supply electricity to the LED element of such a light source, wiring is imprinted on a ceramic substrate using silver paste and the ceramic substrate is sintered, whereby an electricity-supplying circuit is formed.

However, a problem is presented in that light reflectivity changes with the color and width of the silver wiring layer forming the electricity-supplying circuit. When a surface mount chip LED or the like is installed on the ceramic substrate, the chip LED needs a reflector.

Furthermore, an advanced installation technique is necessary to produce a light source having exceptional uniformity and positional accuracy in a light-emitting state.

In the past, there have been known light-emitting devices having LED elements built into an airtight container in which an LED is accommodated on a substrate comprising an inorganic material, a phosphor layer is applied to an inner surface of the airtight container, and a vacuum atmosphere or an inert gas atmosphere is present inside the airtight container (Patent Document 1).

However, when a chip LED is mounted on a ceramic substrate, it is difficult to adjust the flatness of the ceramic substrate, the angle of the attached reflector, and the flatness of the surface mount. Therefore, it is difficult to obtain a stable light-emitting surface because the axis at which the light is emitted by the chip LED varies.

When an LED display is configured using a single LED element as a single pixel, conventional LED elements must have a plastic or other enclosure formed thereon as with molded-plastic LED elements, and the external dimensions thereof make it harder to increase the resolution of the LED light-emission spacing.

PRIOR ART DOCUMENTS

Patent Documents

Patent Document 1: Japanese Laid-Open Patent Publication

SUMMARY OF THE INVENTION

Problem to be Solved by the Invention

The present invention was devised in order to solve such problems, an object of the present invention being to provide a substrate for mounting an LED element in which a stable light-emitting surface is obtained, as well as an LED light source and an LED display using this substrate, so that the axis at which light is emitted by a chip LED does not vary.

Means for Solving the Problem

The substrate for mounting an LED element of the present invention comprises a substrate on which an LED element can be mounted, and a wiring layer for supplying electricity to the LED element. The substrate for mounting an LED element is characterized in that the wiring layer for supplying electricity to the LED element is formed on a mirror-finished surface on the entirety of a substrate surface on which the LED element is mounted, except for an insulating space capable of providing insulation between terminals of the LED element.

The substrate for mounting an LED element of the present invention is characterized in that, along with the insulating space, the wiring layer is provided with a light-transmission space capable of transmitting light from the surroundings of the LED element.

The substrate for mounting an LED element of the present invention is characterized in that the substrate is a mirror-surface glass substrate, and the wiring layer is an electricity-supplying circuit formed on the mirror-finished surface of the mirror-surface glass substrate.

The substrate for mounting an LED element of the present invention is characterized in that the wiring layer forming this electricity-supplying circuit is a metal thin-film formed on the mirror-surface glass substrate. In particular, the substrate for mounting an LED element is characterized in that the metal thin-film is an aluminum thin-film.

The LED light source of the present invention is characterized in that an LED element is disposed inside a sealed container formed from a sealed-container substrate, face glass, and spacer glass, and the sealed-container substrate is the substrate for mounting an LED element of the present invention.

The LED display of the present invention is obtained by disposing an LED element inside a sealed container formed from a sealed-container substrate, face glass, and spacer glass, characterized in that the front-surface face glass of the LED display is a substrate for mounting an LED element in which an LED element is positioned on the inner-surface side of the sealed container, the substrate for mounting an LED element has a wiring layer provided with an insulating space capable of providing insulation between terminals of the LED element and a light-transmission space capable of transmitting light from the surroundings of the LED element, and the sealed-container substrate has a light-reflecting surface capable of reflecting light toward the inner surface of the sealed container.

The LED display of the present invention is further characterized in that a light-shielding layer is formed on the substrate for mounting an LED element comprising the face glass, except for the edge of the light-transmission space, and a substrate light-shielding layer is formed on the sealed-container substrate, on a lower part of the light-shielding layer region.

Effect of the Invention

Because the entirety of the substrate surface on which the LED is mounted is formed on the mirror-finished surface, except for a very small space on an insulating portion, the entire surface of the substrate for mounting an LED element of the present invention can be made to emit light using the LED element.

Furthermore, because the LED element is disposed inside a sealed container formed from the substrate for mounting an LED element, the face glass, and the spacer glass, it is possible to greatly improve the environment resistance to a degree at which there is minimal degradation in the moisture resistance, heat resistance, color fading and other attributes of the light source of the present invention. Furthermore, using, on the face glass, the substrate for mounting an LED element provided with the light-transmission space makes it possible to realize text displays and LED arrays in 5×7-dot, 16×16-dot, and other configurations.

MODE FOR CARRYING OUT THE INVENTION

Substrates that can be used in the present invention include glass substrates, ceramic substrates, plastic substrates, and other substrates capable of being imparted with a mirror-finished surface and allowing the formation of a portion of a sealed container when the light source is formed. A glass substrate having exceptional sealing properties and having a mirror-finished surface is particularly preferred. A "mirror-finished surface" is a surface that has been smoothed so as to be capable of reflecting light uniformly but not diffusely.

A glass material to be used in a fluorescent display or a liquid crystal display device can be used as the glass substrate. Examples of such a glass substrate include, e.g., soda-lime glass, white crown glass, aluminosilicate glass, borosilicate glass, synthetic silica glass, etc.

A wiring layer is formed on the entire surface of the glass substrate, except for the insulation space, or the insulation space and the light-transmission space, described above.

The wiring layer has electric-conductive properties, and any material having a mirror-finished surface can be used therefor, although a metal thin-film is preferred. This metal thin-film can be formed on the glass substrate by sputtering, vapor-deposition, or another such method. Examples of the material for the metal thin-film include aluminum, gold, silver, copper, etc., although aluminum is preferred due to being readily used industrially and being readily prepared as a thin film on the glass substrate.

When the substrate of the present invention is used inside a sealed container, a highly heat-conductive layer can be provided between the glass substrate and the aluminum thin-film for the purpose of improving the heat-radiating properties of the LED element. Examples of the highly heat-conductive layer include molybdenum oxide thin-films, titanium thin-films, and magnesium oxide thin-films.

A heat sink can also be attached to the outer side of the glass substrate of the sealed container.

Figure 1A:
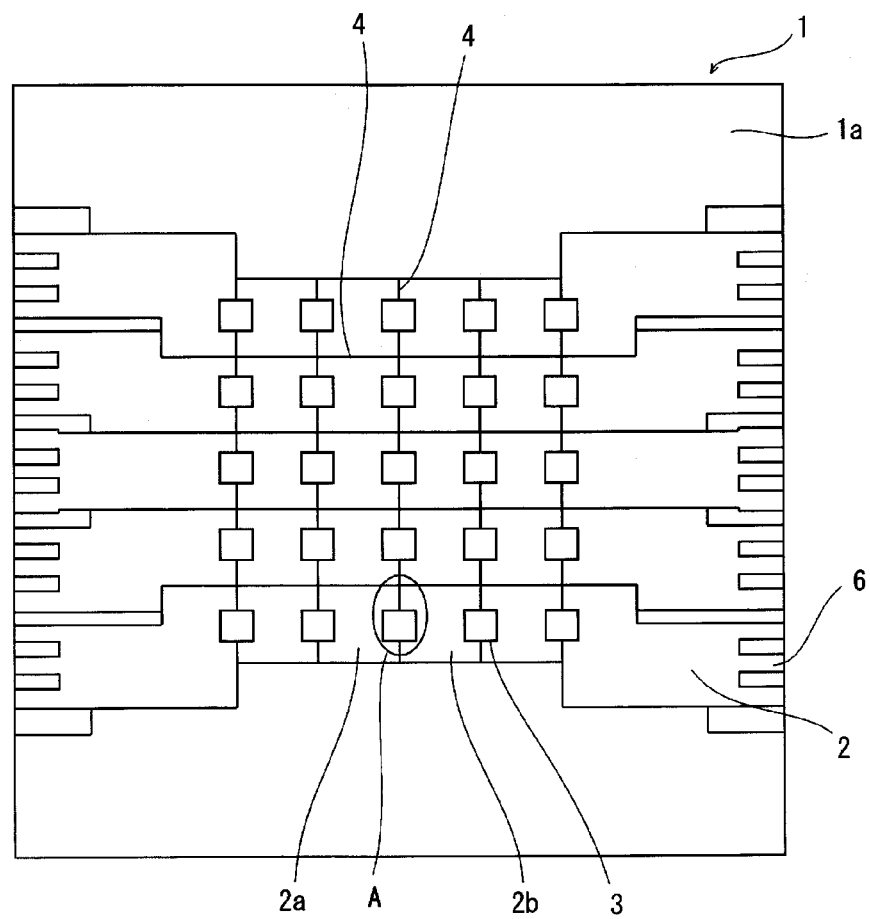
FIG. 1A is a planar view of the wiring layer pattern on the substrate for mounting an LED element.
Figure 1B:
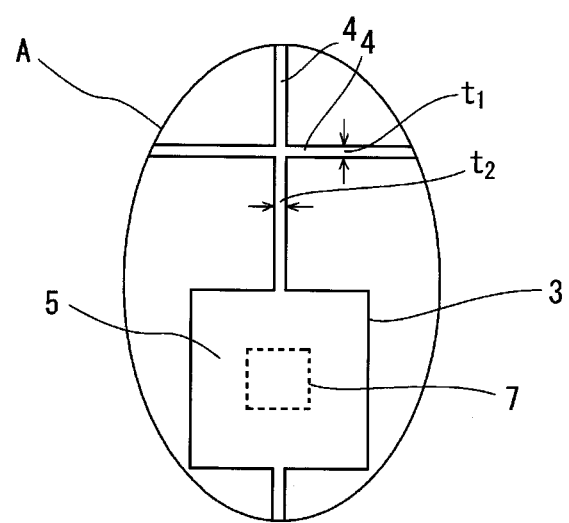
FIG. 1B is an enlarged planar view of A in FIG. 1A.

FIG. 1A shows a planar view of the wiring layer pattern, and FIG. 1B shows an enlarged planar view of A in FIG. 1A.

A substrate 1 for mounting an LED element has a wiring layer 2 formed on a mirror-finished surface on the entirety of a substrate 1a on which an LED element can be mounted, the wiring layer 2 having formed thereon an open space 3 in which the LED element is placed and an insulating space 4 capable of providing insulation between terminals of the LED element. A lead part 6 serving as an electricity-supplying terminal is formed on an end part of the wiring layer 2.

The width $t_1$, $t_2$ of the insulating space 4 is preferably reduced within a range at which no short-circuiting occurs between the terminals of the LED element to which electricity is supplied. For example, it is preferable the width is from 5 μm to 300 μm. Reducing the width of the insulating space 4 gives the entire substrate surface the appearance of a mirror-finished surface. More specifically, the entire substrate looks like a mirror-finished surface to the naked eye.

Providing the insulating layer 4 allows, e.g., a wiring layer 2a and a wiring layer 2b to be electrically insulated.

The open space 3 in which the LED element is placed can be set according to the type of LED element, the size and shape as seen in plan view, or other properties within a range that does not compromise imparting the entire substrate surface with a mirror finish.

As shown in FIG. 1B, the open space 3 is set to be at least the size of the mounted LED element 7 as seen in plan view, whereby the area surrounding the mounted LED element 7 becomes a light-transmission space 5.

The wiring layer pattern can be formed using a well-known photolithography method.

Examples of an LED element that can be used in the present invention include a light-emitting diode chip (flip chip, bare chip) commercially used as a light-emitting diode, a packaged surface-mounted light-emitting diode (chip LED), a semiconductor laser chip, etc.

Methods for mounting the LED element on the substrate include wire bonding, directly soldering a terminal provided to the bottom surface of the chip, etc.

The method for arranging the LED element can involve arranging the surface and array of the LED element in conformity to the shape of the substrate before mounting the LED element to the substrate. The arrangement may be regular or irregular.

Figure 2A:
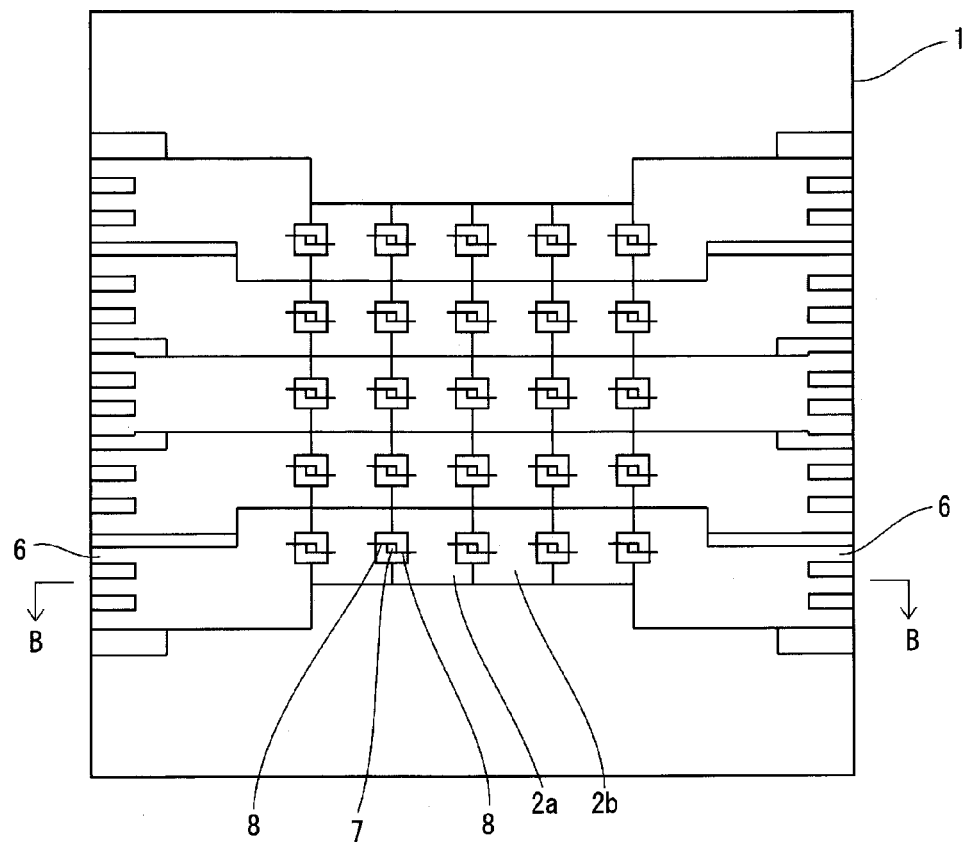
FIG. 2A is a planar view of the LED element installed on the substrate for mounting an LED element.
Figure 2B:
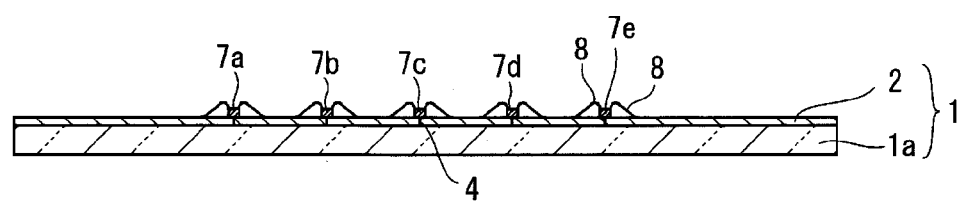
FIG. 2B is a cross-sectional view along B-B in FIG. 2A.

FIG. 2A is a planar view of the LED element installed on the substrate 1 for mounting an LED element shown in FIG. 1A, and FIG. 2B is a cross-sectional view along B-B in FIG. 2A.

The wiring layer 2 formed on the substrate 1a on which an LED element can be mounted is electrically insulated by the insulating space 4 interposed between, e.g., the wiring layer 2a and the wiring layer 2b. Therefore, as shown in FIG. 2B, LED elements 7a, 7b, 7c, 7d, 7e connected to the wiring layer 2 by wire bonding 8 are electrically arranged in series, and are simultaneously supplied with electricity by the lead part 6.

In this state, the substrate 1 for mounting an LED element, on which the LED element 7 is mounted, can assume the function of a light source. The entire surface of the wiring layer 2 is mirrored, the optical axes are uniform because the LED element 7 is mounted on a substrate having a smooth surface, and the wiring layer 2 disposed on the entirety of the substrate surface forms a heat-radiating layer; therefore, a surface-emitting light source that consistently and evenly emits light can be obtained.

By using the substrate 1 for mounting an LED element, it is possible to easily manufacture a sealed LED light source and an LED display.

Figure 3:
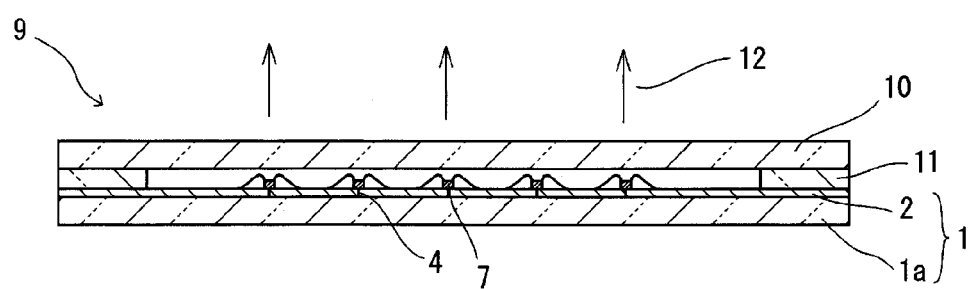
FIG. 3 is a view of an example of a sealed LED light source.

FIG. 3 shows an example of a sealed LED light source. The LED light source 9 has the substrate 1 for mounting an LED element, on which the LED element 7 is disposed, as a sealed-container substrate, a box-type sealed container being formed by spacer glass 11 arranged around the sealed-container substrate and face glass 10 constituting a light-radiating surface. The LED element 7 disposed inside the box-type sealed container radiates light upward, with respect to the drawing, as outgoing light 12 (shown by the arrows), thereby forming an LED light source for illumination.

The box-type sealed container is obtained by sealing together the substrate 1 for mounting an LED element, the face glass 10, and the spacer glass 11 through bonding using a bonding agent, or using low-melting-point glass or the like. Moisture and oxygen gas are preferably removed from the interior of the sealed container. Eliminating moisture and oxygen gas prevents deterioration of the LED element 7 over time and extends the service life of the LED light source.

Sealing using low-melting-point glass can be performed at from 430° C. to 580° C., and the pressure inside the sealed container can be set to atmospheric pressure. Alternatively, by using a vacuum pump during sealing, the air and gas in the container can be discharged to reduce the pressure and form a vacuum container.

Electricity is supplied to the sealed LED light source by drawing out the lead part 6 or the like from the glass end surface to form an electrical connection with an external circuit when the box-type sealed container is formed. Alternatively, an electrical connection can be established by connecting an anisotropically conductive film and an FPC by compressive joining.

An aluminum heat-radiating plate (not shown) can also be placed on the reverse surface of the substrate 1 for mounting an LED element.

Figure 4A:
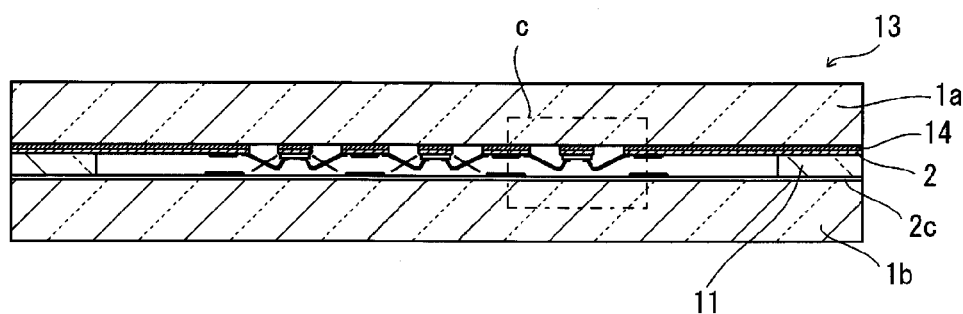
FIG. 4A is an example of a cross-sectional view of an LED display.
Figure 4B:
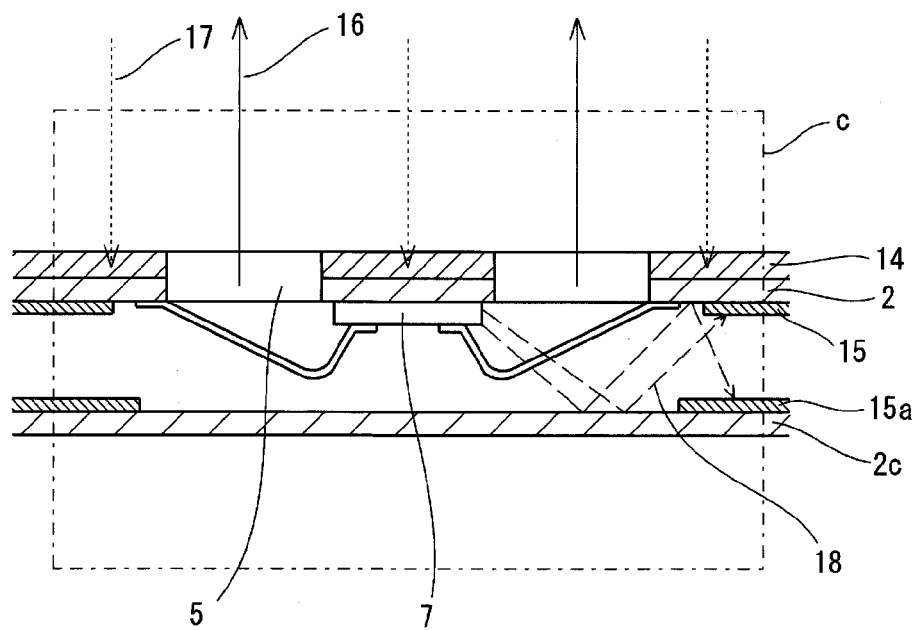
FIG. 4B is an enlarged cross-sectional view of C in FIG. 4A.

FIG. 4A is an example of a cross-sectional view of an LED display, and FIG. 4B is an enlarged cross-sectional view of C in FIG. 4A.

The front-surface face glass 1a of an LED display 13 is formed with the LED element 7 positioned on the inner-surface side of the sealed container, and light 18 irradiated from a single LED element 7 is reflected by a light-reflecting layer 2c of a sealed-container substrate 1b and irradiated by the light-transmission space 5; therefore, the light 18 can be seen on the front-surface face glass 1a as a single dot. Positioning the LED element 7 in a 5×7-dot, 16×16-dot, or other configuration makes it possible to realize LED arrays and text displays.

In the LED display 13, the substrate 1a on which the LED element 7 shown in FIG. 1 is mounted is face glass, and the sealed container is formed from the sealed-container substrate 1b having the light-reflecting surface and the spacer glass 11.

The substrate 1a on which an LED element can be mounted can be manufactured by a well-known method for sequentially forming a heat-radiating layer 14 made of molybdenum oxide or the like and a wiring layer 2 made of an aluminum thin-film or the like on a glass substrate by sputtering, vapor-deposition, or another such method and then photolithographically forming a pattern. A light-shielding layer 15 is preferably formed above the wiring layer 2 in a region other than one in which a single dot is formed.

The sealed-container substrate 1b preferably has a light-reflecting layer 2c made of an aluminum thin-film or the like provided to the entire surface of the glass substrate, and a light-shielding layer 15a provided at a position facing the light-shielding layer 15.

In the LED display 13 configured as described above, light emitted by the LED element 7 exits as outgoing light 16 through the light-transmission space 5 provided to the wiring layer 2. Some light 18 is absorbed by the light-shielding layer 15a. Symbol 17 represents external light oriented toward the LED display 13.

INDUSTRIAL APPLICABILITY

The LED light source using the substrate for mounting an LED element of the present invention is highly efficient, consumes little power, and has uniform and stable optical axes, and can therefore be used as illumination for cell phones, household electrical appliances, industrial devices, control systems, computer peripheral devices, and the like. This LED display can be used as an LED array or text display having exceptional visibility.

EXPLANATION OF REFERENCE NUMERALS AND SYMBOLS

1 Substrate for mounting LED element
2 Wiring layer
3 Open space in which LED element is placed
4 Insulating space
5 Light-transmission space
6 Lead part
7 LED element
8 Wire bonding
9 LED light source
10 Face glass
11 Spacer glass
12 Outgoing light
13 LED display
14 Heat-radiating layer
15 Light-shielding layer
16 Outgoing light
17 External light oriented toward LED display
18 Light irradiated from LED element

The invention claimed is:

1. An LED display in which an LED element is disposed inside a sealed container characterized in that:
   said sealed container comprises:
   front-surface face glass, the front-surface face glass having an inner surface on which the LED element is mounted;
   a wiring layer for supplying electricity to the LED element, the entire surface of the wiring layer being mirrored and the wiring layer being formed entirely on the inner surface of the front-surface face glass on which the LED element is mounted, wherein the wiring layer has an insulating space capable of providing insulation between terminals of the LED element and a light-transmission space capable of transmitting light from the surroundings of the LED element;
   spacer glass; and
   a sealed-container substrate, the sealed-container substrate has a light-reflecting surface capable of reflecting light toward the inner surface of the front-surface glass.

2. The LED display of claim 1, characterized in that the front-surface face glass is a mirror-surface glass substrate, and the wiring layer is an electricity-supplying circuit formed on the inner surface of the front-surface face glass which is a mirror surface.

3. The LED display of claim 2, characterized in that the electricity-supplying circuit is a metal thin-film wiring layer formed on the mirror-surface glass substrate.

4. The LED display of claim 3, characterized in that the metal thin-film wiring layer is an aluminum thin-film wiring layer.

5. The LED display of claim 1, characterized in that
- a light-shielding layer is formed on the inner surface of the front-surface glass, except for the edge of the light-transmission space, and
- a substrate light-shielding layer is formed on the sealed-container substrate, on a lower part of the light-shielding layer region.

* * * * *